United States Patent
Shieh et al.

(10) Patent No.: US 9,020,791 B2
(45) Date of Patent: Apr. 28, 2015

(54) PROCESS FOR DESIGNING AND MANUFACTURING AN IGNITION SYSTEM FOR AN INTERNAL COMBUSTION ENGINE

(75) Inventors: Tenghua Tom Shieh, Ann Arbor, MI (US); Oana Nitulescu, Ann Arbor, MI (US); Bogdan Radu Kucinschi, Ann Arbor, MI (US); Kiyotaka Yamashita, Ann Arbor, MI (US)

(73) Assignee: Toyota Motor Engineering & Maunfacturing North America, Inc., Erlanger, KY (US)

( * ) Notice: Subject to any disclaimer, the term of this patent is extended or adjusted under 35 U.S.C. 154(b) by 466 days.

(21) Appl. No.: 13/311,702

(22) Filed: Dec. 6, 2011

(65) Prior Publication Data
US 2013/0144580 A1 Jun. 6, 2013

(51) Int. Cl.
*G06F 17/50* (2006.01)
*H01F 38/12* (2006.01)

(52) U.S. Cl.
CPC .......... *H01F 38/12* (2013.01); *G06F 17/5009* (2013.01)

(58) Field of Classification Search
CPC ............ G05B 2219/35167; H01F 38/12; G06F 17/50; G06F 2217/12; F02D 2200/02; F02P 9/007
USPC .......................................... 703/7; 123/179.4
See application file for complete search history.

(56) References Cited

U.S. PATENT DOCUMENTS

| | | | |
|---|---|---|---|
| 5,568,801 A * | 10/1996 | Paterson et al. ............... | 123/598 |
| 2004/0220720 A1 | 11/2004 | Noda | |
| 2007/0239345 A1 | 10/2007 | Bizub | |
| 2007/0265805 A1 | 11/2007 | Lee et al. | |
| 2007/0288213 A1 | 12/2007 | Schantl et al. | |
| 2009/0182485 A1 | 7/2009 | Loeffler et al. | |
| 2009/0235728 A1 | 9/2009 | Sinnamon | |

FOREIGN PATENT DOCUMENTS

WO    WO-2007084242 A1    7/2007

OTHER PUBLICATIONS

Thiele et al., "Numerical Simulation of Spark Ignition Including Ionization", Jan. 2000, Proceedings of the Combustion Institute, vol. 28, pp. 1177-1185.*
Deng et al., "Simulation research of EMI on automotive ignition system," Automation Congress, 2008. WAC 2008. World , vol., no., pp. 1,4, Sep. 28 2008-Oct. 2 2008.*
Ööberg, Per. A DAE Formulation for Multi-Zone Thermodynamic Models and its Application to CCCP Engines. (Dissertation) 2009. Linköping University, Department of Electrical Engineering, Vehicular Systems.*
Chan, Edward. Spark Ignition of Partially Stratified Gaseous Fuel-Air Mixtures. 2010 Doctoral Thesis, University of British Columbia.*
Deng et al., "Simulation research of EMI on automotive ignition system," Automation Congress, 2008. WAC 2008. World, vol., no., pp. 1,4, Sep. 28 2008-Oct. 2 2008.*
Thiele et al., Proceedings of the Combustion Institute Publication (Feb. 2000), "Numerical Simulation of Spark Ignition Including Ionization", (hereinafter Thiele).*

* cited by examiner

*Primary Examiner* — Robert Fennema
*Assistant Examiner* — Fenyang Stewart
(74) *Attorney, Agent, or Firm* — Gifford, Krass, Sprinkle, Anderson & Citkowski, P.C.

(57) ABSTRACT

The present invention provides a process for designing and manufacturing an ignition system for an internal combustion engine. The process can include performing a plurality of simulations that include simulating an electrical circuit with a spark initiating device for igniting the fuel mixture within an internal combustion chamber, an electrical breakdown proximate to the spark initiating device, a plasma arc and an afterglow regime.

14 Claims, 6 Drawing Sheets

ELECTRICAL BREAKDOWN

PLASMA ARC

FLAME KERNEL

PROCESS FOR DESIGNING AND MANUFACTURING AN IGNITION SYSTEM FOR AN INTERNAL COMBUSTION ENGINE

FIELD OF THE INVENTION

The present invention is related to a process for designing and manufacturing an ignition system for an internal combustion engine, and in particular a process for designing and manufacturing an ignition system through the use of internal combustion chamber, ignition coil, spark plug, and fuel mixture simulations.

BACKGROUND OF THE INVENTION

The use of internal combustion engines to produce power, transportation, and the like is known. Such internal combustion engines typically have an internal combustion chamber into which fuel is introduced and under pressure, combustion of a fuel+air mixture occurs resulting in a rapid expansion of the fuel mixture and its byproducts. The rapid expansion is typically used to move a piston which is in mechanical connection with a crankshaft. The crankshaft can thus be rotated and used to provide mechanical power to an output shaft. In some instances, combination of a spark and pressure is used to ignite and combust the fuel mixture within the internal combustion chamber.

The parameters of an ignition system for an internal combustion engine can be critical with respect to the energy efficiency of the engine. Such parameters can be related to ignition coil properties, spark plug properties, fuel properties, shape of the internal combustion chamber, and the like. In addition, how such properties interact with each other to provide an initial spark with subsequent combustion of the fuel mixture within the internal combustion chamber could be useful in designing an internal combustion engine. However, heretofore methods or processes have not inter-linked properties, parameters, etc., of various components of an internal combustion engine together to provide a complete ignition system analysis. Stated differently, heretofore studies, processes, and the like have investigated various components of an internal combustion system ignition system individually, but have failed to properly link how such components interact with each other. Therefore, a process that simulates and/or provides the interaction of such components with each other for the purpose of increasing fuel efficiency would be desirable.

SUMMARY OF THE INVENTION

The present invention provides a process for designing and manufacturing an ignition system for an internal combustion engine. The process can include performing a plurality of simulations that include simulating an internal combustion chamber for the internal combustion engine, simulating a fuel mixture within the internal combustion chamber, and simulating an electrical circuit with a spark initiating device for igniting the fuel mixture within the internal combustion chamber. In addition, an electrical breakdown proximate to the spark initiating device that results in ionizing channels extending from the spark initiating device and into the fuel mixture can be simulated, as can a plasma arc resulting from ionized fuel proximate the spark initiating device. Thereafter, transfer of energy from the plasma arc to the fuel mixture within the internal combustion engine can be simulated and the results from the simulations can be used to select parameters for an ignition system. Thereafter, an ignition system can be manufactured as a function of the selected parameters.

Parameters of the electrical circuit can be a function of ignition coil and spark initiating device parameters such as: a primary coil voltage, current, resistance, inductance and electrical energy; a secondary coil voltage, current, resistance, inductance and electrical energy; a spark initiating device voltage, current, resistance, inductance and electrical energy; and combinations thereof. The simulation of the fuel mixture within the combustion chamber can be a function of temperature, pressure, velocity, electrical properties, and/or chemical composition of the fuel mixture proximate to the spark initiating device.

Regarding the electrical breakdown proximate to the spark initiating device, the breakdown can be simulated as a function of a breakdown voltage, a breakdown current, a breakdown time duration, a breakdown temperature, a breakdown energy deposition, a breakdown energy efficiency, and combinations thereof. With respect to the plasma arc resulting from the electrical breakdown ionizing fuel mixture proximate to the spark initiating device, the plasma arc can be simulated as a function of an arc voltage, an arc current, an arc duration, an arc temperature, an arc energy deposition, an arc energy efficiency, and combinations thereof.

The transfer of energy from the plasma arc to remaining fuel mixture within the internal combustion chamber can be simulated as a function of an afterglow voltage, an afterglow current, an afterglow duration, an afterglow temperature, an afterglow energy deposition, an afterglow energy efficiency, and combinations thereof.

The simulation of the transfer of energy from a flame kernel to remaining fuel mixture within the internal combustion chamber can be a function of turbulent flame propagation and is subject to combustion modeling and/or analysis

DETAILED DESCRIPTION OF THE PRESENT INVENTION

Figure 1:
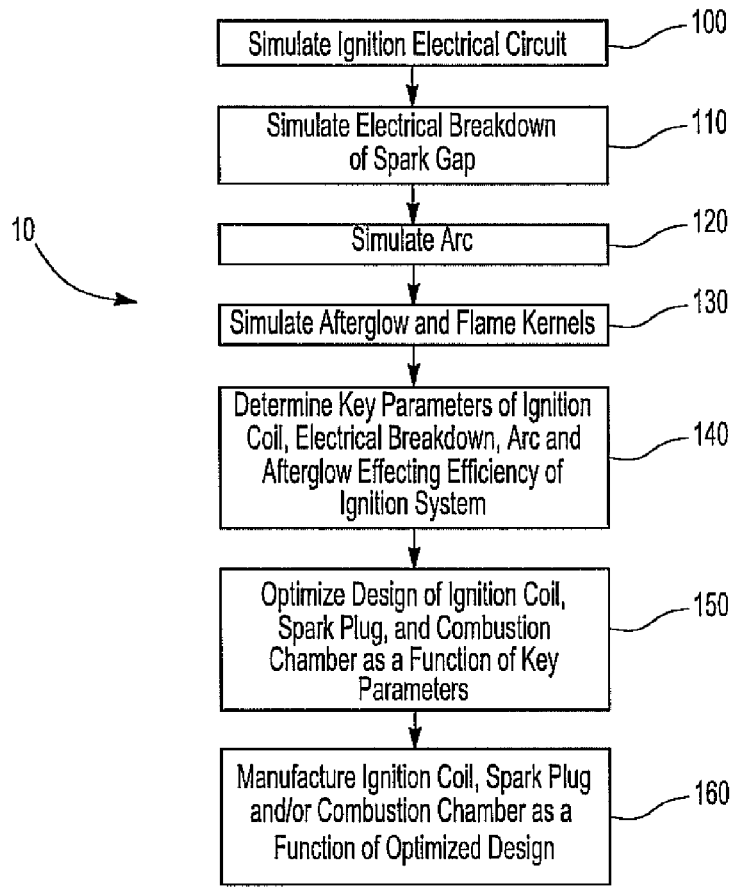
FIG. 1 is a schematic flowchart illustrating a process for designing and manufacturing an ignition system for an internal combustion engine according to an embodiment of the present invention.

The present invention provides a process for designing and manufacturing an ignition system for an internal combustion engine. As such, the process has use as an ignition system optimization tool.

The process can include simulating an internal combustion chamber or, in the alternative, selecting an internal combustion chamber for which an ignition system is desired. In addition, the process can include simulating an electrical circuit having an ignition coil and a spark plug with a gap, for example and for illustrative purposes only, a gap between a central electrode and a side electrode. A fuel mixture within and/or proximate to the gap of the spark plug is also simulated, as is an electrical breakdown across the gap.

The process can also include simulation of fuel mixture ionization within and/or proximate to the spark plug gap that results from the electrical breakdown, as can simulation of a plasma arc resulting from ionization of the fuel mixture. Furthermore, transfer of energy from the plasma arc to fuel mixture remaining within the combustion chamber can be simulated. It is appreciated that analysis of the simulations can afford for selection of key parameters that affect the combustion of the fuel mixture, energy efficiency of the ignition system and/or energy efficiency of the internal combustion engine. Thereafter, an ignition system can be manufactured as a function of the key parameters. In the alternative, additional simulations as a function of the key parameters can be used to optimize the design and manufacture of an ignition coil, spark plug, combustion chamber and the like for the internal combustion engine.

The process can further include linking and/or inter-linking the above-described simulations such that modeling and/or simulation of an entire ignition system for an internal combustion engine can be provided. Stated differently, simulation of the ignition coil can be interlinked with simulation of the electrical breakdown of the spark gap, which can be inter-linked with creation of the plasma arc, which can be inter-linked with the after glow region and the like. In this manner, the interdependence, or lack thereof, of parameters related to the ignition coil, electrical breakdown across a spark gap, plasma arc across a spark gap, and afterglow on the overall efficiency of the ignition system can be optimized and/or determined.

The simulated combustion within the combustion chamber is a complex combination of aerodynamic and thermo-chemical processes due to turbulence and chemistry interactions that occur over a broad range of time-scale and length-scale levels. In some instances, transport equations using a non-reactive scalar, G, for laminar flame propagation and/or turbulent flame propagation, with the incorporation of elementary chemical kinetic mechanisms is used to model or simulate the turbulent combustion. In addition, detailed fuel oxidation mechanisms coupled with reduced $NO_x$ mechanisms can be completely solved and coupled with flow equations for tracking a flame front propagation. It is appreciated that one or more of the simulations are performed with computer having primary and secondary memory, a central processing unit (CPU), look-up tables created and/or stored in the memory, data created and/or stored in the memory, and the like as is known to those skilled in the art.

Turning now to FIG. 1, a schematic flowchart for a process according to an embodiment of the present invention is shown generally at reference numeral 10. The process 10 includes simulation of an ignition electrical circuit at step 100 and simulation of electrical breakdown across a spark gap at step 110. It is appreciated that electrical breakdown across the spark gap can afford for the creation and/or formation of a plasma arc which is simulated at step 120. The arc can afford for an afterglow regime with flame kernel formation that grow into the combustion chamber which can be simulated at step 130. Simulation of the ignition coil, electrical breakdown, plasma arc, and afterglow can then be used to determine key parameters affecting efficiency of the ignition system.

After the key parameters of the ignition system have been determined, these parameters can be used for designing and/or performing additional simulations of the ignition coil, spark plug and/or combustion chamber in order to provide an ignition system, combustion chamber, etc. with improved fuel efficiency. Thereafter, a prototype of such an ignition system can be manufactured, tested, etc. for the purpose of eventual use within a consumer product.

Figure 2:
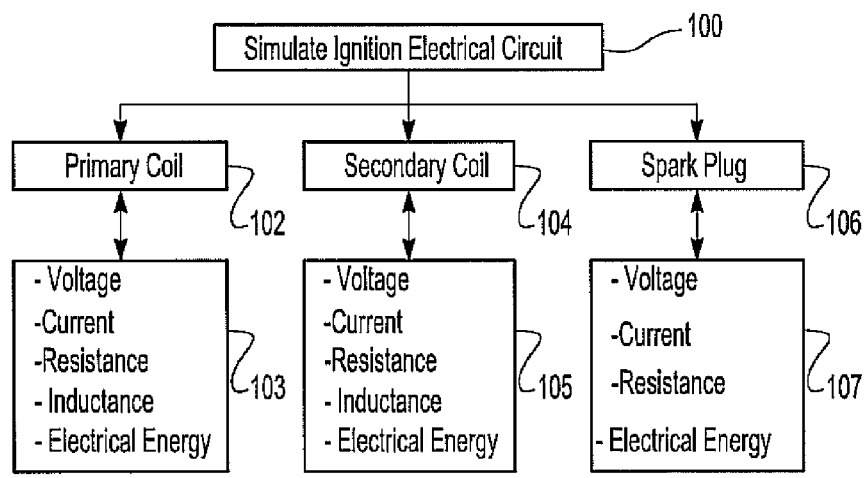
FIG. 2 is a schematic illustration of the inputs and/or outputs for simulation of an ignition electrical circuit according to an embodiment of the present invention.

Turning now to FIG. 2, a schematic diagram of the simulation of the ignition electrical circuit at step 100 with additional details is shown. The ignition electrical circuit can have a primary coil which can be simulated at step 102, a secondary coil simulated at step 104 and a spark plug simulated at step 106. Each of the primary coil, secondary coil, and spark plug simulations can have as an input and/or output the list of variables shown at steps 103, 105, and 107, respectively. In particular, and for example, the primary coil simulation at step 102 can include a primary coil voltage, a primary coil current, a primary coil resistance, a primary coil inductance, and a primary coil electrical energy as inputs and/or outputs. Similarly, the secondary coil simulation at step 104 can include a secondary coil voltage, secondary coil current, secondary coil resistance, secondary coil inductance, and/or secondary coil electrical energy as inputs and/or outputs. And finally, simulation of the spark plug at step 106 can include a spark plug voltage, spark plug current, spark plug resistance, and/or spark plug electrical energy as inputs and/or outputs.

Figure 3:
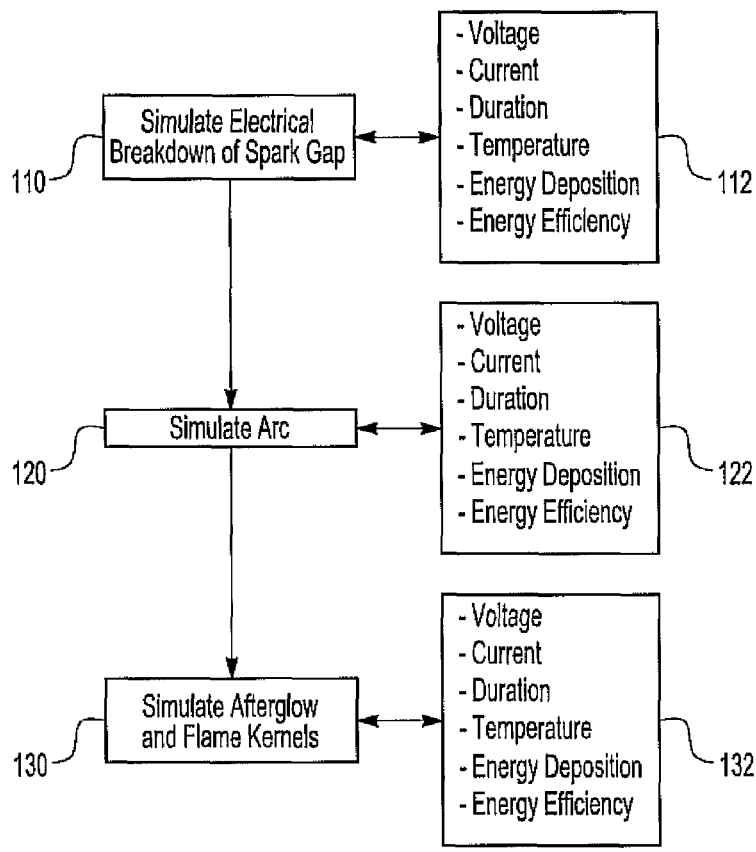
FIG. 3 is a schematic illustration of inputs and/or outputs for simulation of a spark breakdown, arc, and flame kernels according an embodiment of the present invention.

Regarding simulations of the electrical breakdown across a spark gap at step 110, reference numeral 112 in FIG. 3 illustrates that voltage across the spark gap, current across the spark gap, a duration of the breakdown across the spark gap, temperature across the spark gap, an energy deposition across the spark gap, and/or an energy efficiency of the breakdown across the spark gap can be inputs and/or outputs for this simulation. In addition, reference numerals 122 and 132 illustrate that a voltage, current, duration, temperature, energy deposition and/or energy efficiency of the arc and afterglow region, respectively, can be included as inputs and/or outputs for simulations thereof.

Figure 4:
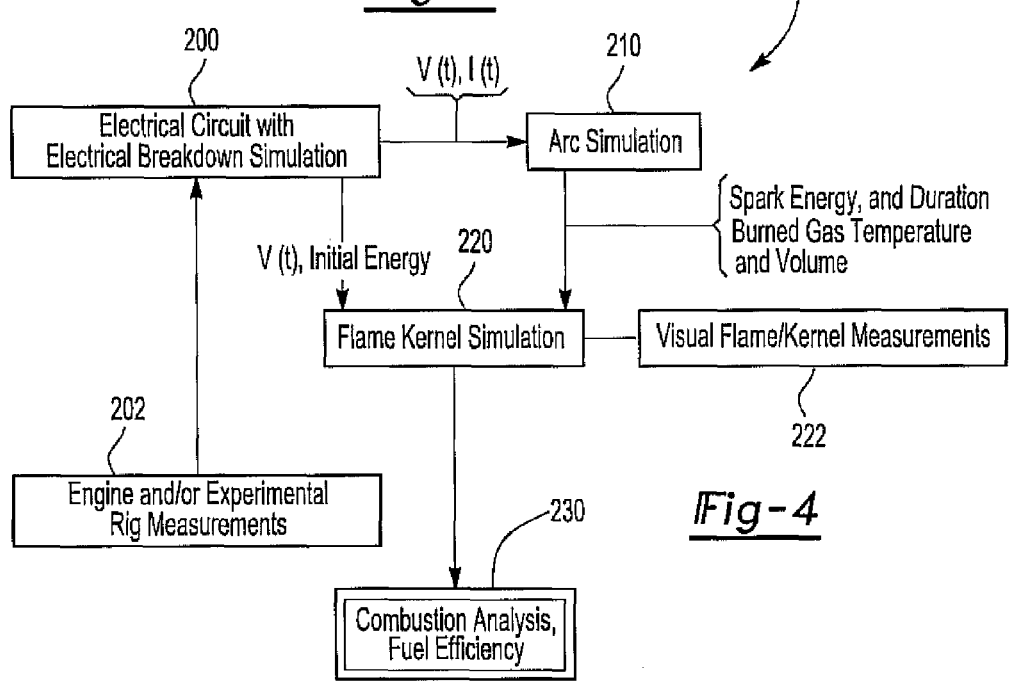
FIG. 4 is a schematic illustration of a model for conducting combustion analysis and/or fuel efficiency according to an embodiment of the present invention.

Referring now to FIG. 4, an overall model according to an embodiment of the present invention is shown generally at reference numeral 20. The model 20 can have a module 200 that affords for simulation of an electrical circuit with electrical breakdown across a spark gap. The module 200 can receive input from an engine and/or an experimental rig module 202. Voltage and current as a function of time from module 200 can be provided to a module 210 which affords for simulation of an arc resulting from the electrical breakdown across the spark gap. Spark energy, duration of the arc, temperature of burnt and/or burning gas, and volume of burnt and/or burning gas obtained from the arc simulation module 210 can be provided to a flame kernel simulation module 220. In addition, voltage as a function of time and initial energy from module 200 can be provided to the flame kernel simulation module 220, which can also be compared to or receive input from a visual flame/kernel measurements module 222.

Results from the flame kernel simulation module 220 can be provided to a combustion analysis and/or fuel efficiency module 230. It is appreciated that simulations from the modules 200-220 can be varied independently or interdependently in order to study the parameters of each module with respect to their effect of combustion analysis and fuel efficiency in module 230. Stated differently, the various parameters of electrical breakdown, arc formation, and flame kernel formation and propagation can be adjusted in order to determine which parameters provide the greatest fuel efficiency via module 230.

Figure 5:
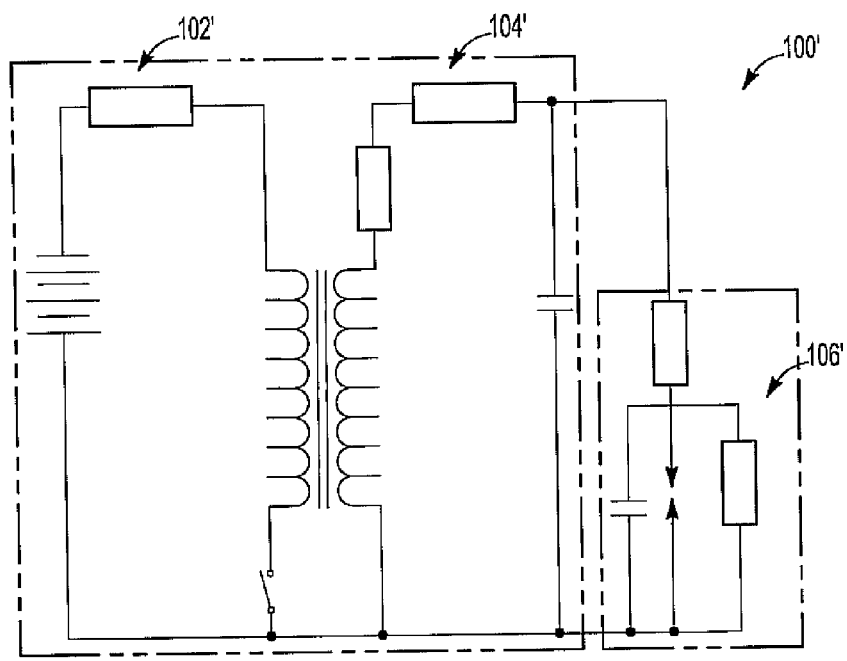
FIG. 5 is a schematic circuit diagram for a representative ignition electrical system that is simulated according to an embodiment of the present invention.

Turning now to FIG. 5, a schematic circuit diagram illustrating an ignition electrical circuit 100' that can be simulated is shown. The simulation of the ignition electrical circuit 100' can include simulation of a primary coil 102', secondary coil 104', and spark plug 106'. From such a simulation, parameters such as primary coil inductance, secondary coil inductance, secondary voltage created when an open circuit is created within the primary coil, voltage across a spark plug gap, current across the spark plug gap, and resistance across the spark plug gap can be investigated. It is appreciated that the voltage, current, and resistance across the spark plug gap can be a function of the energy, heat loss, composition and other characteristics of the fuel mixture within the spark plug gap. As such, additional parameters such as temperature, pressure, velocity, fuel and/or fuel mixture electrical properties, fuel and/or fuel mixture composition, and the like within the spark plug gap can also be studied.

Figure 6:
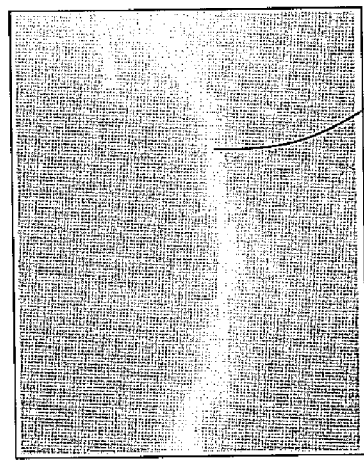
FIG. 6 is a schematic illustration of electrical breakdown within a spark gap that is simulated according to an embodiment of the present invention.
Figure 7:
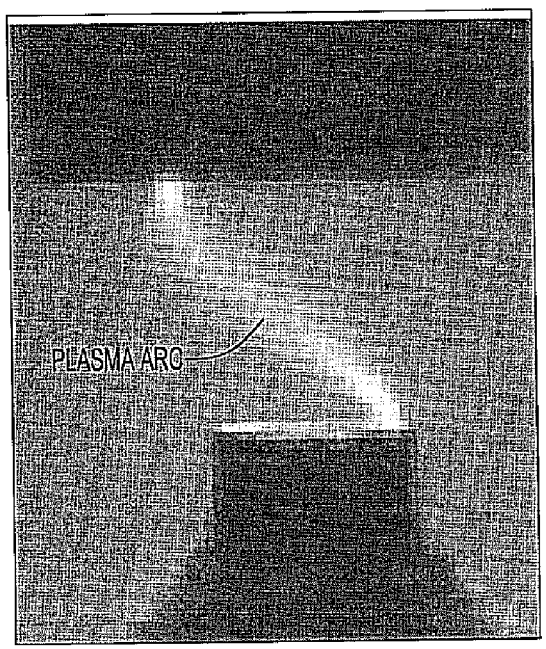
FIG. 7 is a schematic illustration of an arc within a spark gap originating from an electrical breakdown as shown in FIG. 6 according to an embodiment of the present invention.
Figure 8:
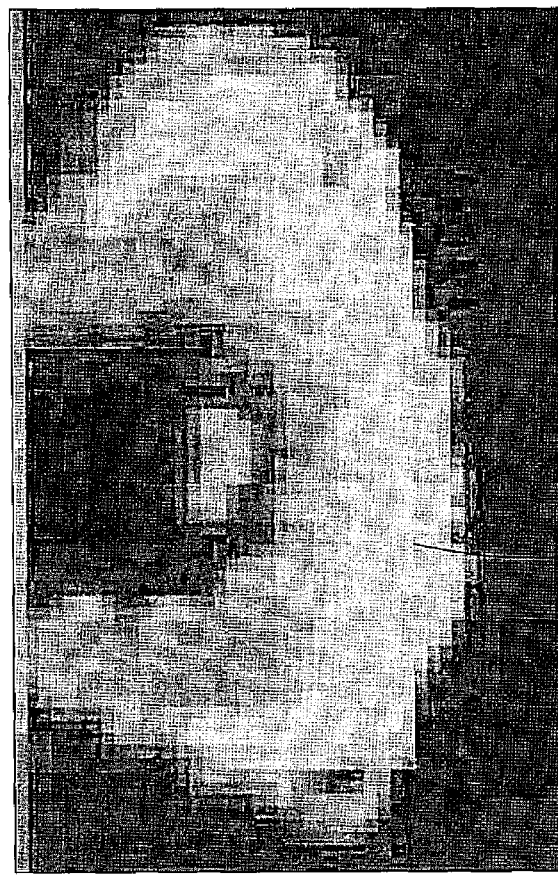
FIG. 8 is a schematic illustration of a flame kernel originating from an arc such as shown in FIG. 7 according to an embodiment of the present invention.

With respect to electrical breakdown across a spark plug gap, FIG. 6 provides a schematic illustration of such an event in which electrical breakdown between a central electrode 108' and a side electrode 109' of the spark plug 106' occurs and affords for ionization of fuel mixture in this region. It is appreciated that ionization of the fuel mixture can afford for the formation of a plasma arc as schematically illustrated in FIG. 7. In addition, the plasma arc can then ignite the fuel mixture and afford for a flame kernel as schematically illustrated in FIG. 8. It is appreciated that the formation and propagation of the flame kernel provides for a rapid expansion as the fuel mixture is burnt or combusted, the rapid expansion typically resulting in the displacement of an object such as a piston, the piston being rotatably connected to a crankshaft in order to provide mechanical power.

Figure 9:
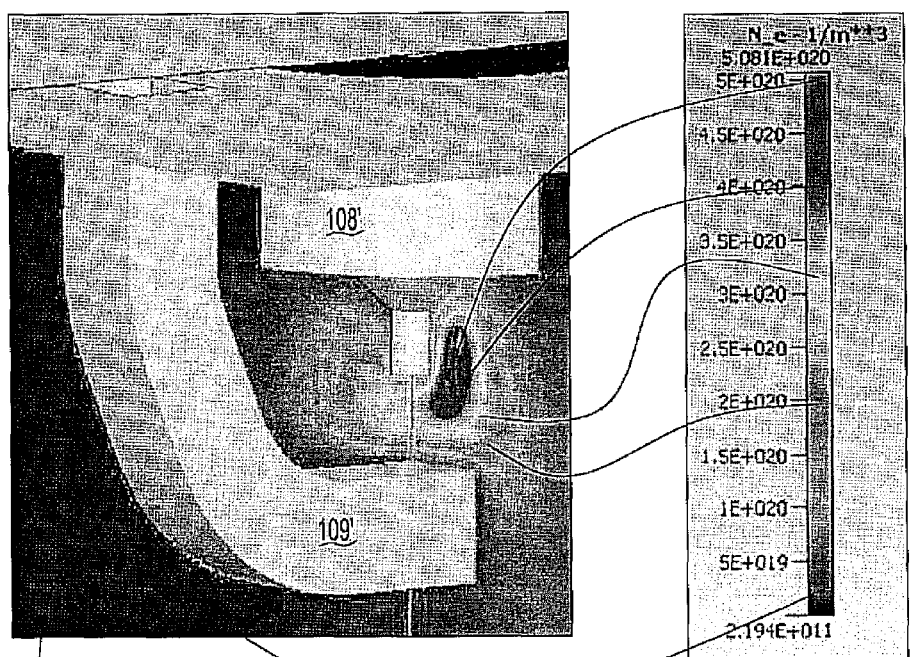
FIG. 9 is a schematic illustration of a plasma arc created by a spark plug and simulated using a computational fluid dynamic model according to an embodiment of the present invention.
Figure 10:
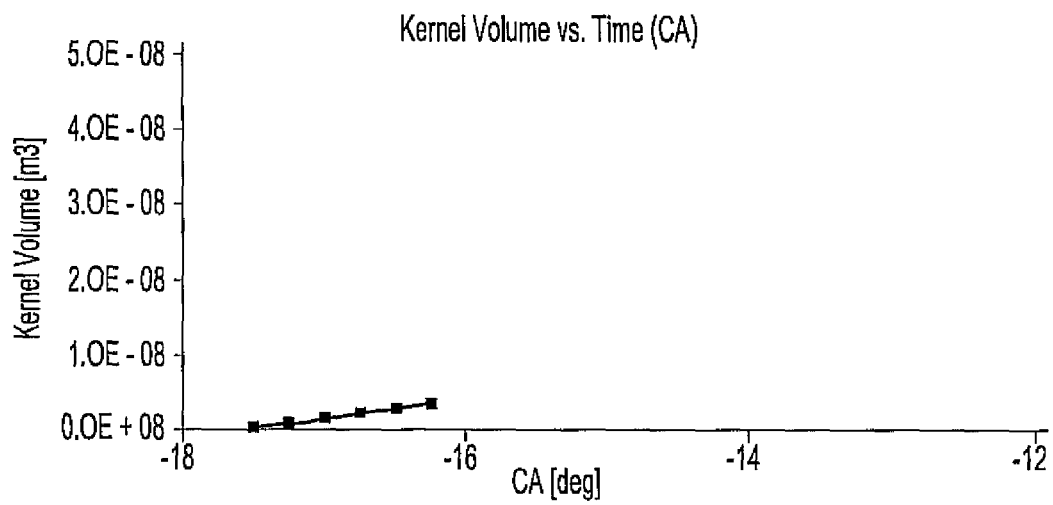
FIG. 10 is a graph of simulated kernel flame volume as a function of time according to an embodiment of the present invention.
Figure 11:
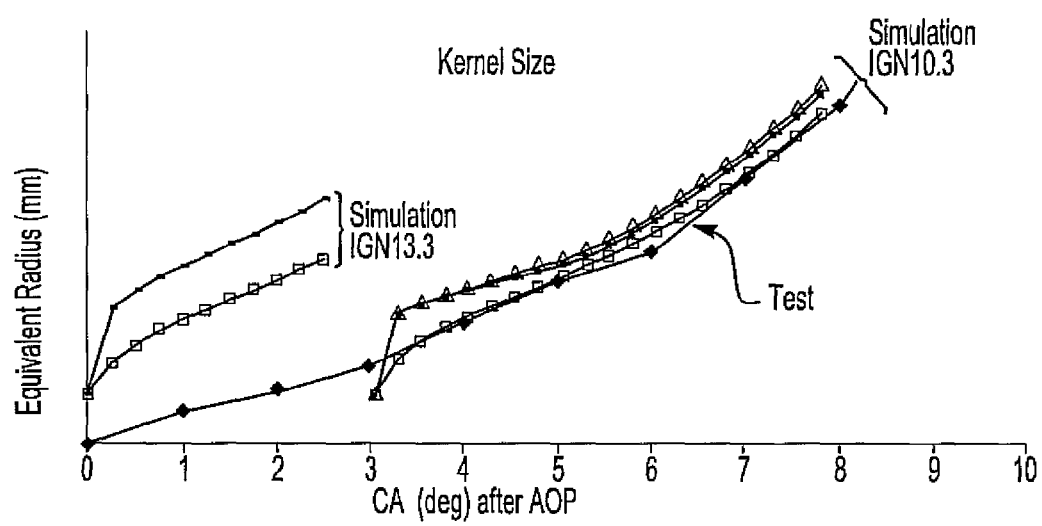
FIG. 11 is a graph of simulated kernel volume as a function of time according to an embodiment of the present invention.

An example of a computational fluid dynamics (CFD) simulation for a plasma arc across a spark plug gap is shown in FIG. 9. As shown in the figure, temperature of the arc proximate to the central electrode 108' and side electrode 109' shape can be provided using one or more CFD modeling systems known to those skilled in the art. Graphs illustrating flame kernel volume as a function of time are shown in FIGS. 10 and 11, these graphs afforded by flame kernel simulations using one or more CFD tools known to those skilled in the art. As shown in the figures, the X-axis is plotted as crank angle which is known to those skilled in the art to be a function of time.

Figure 12:
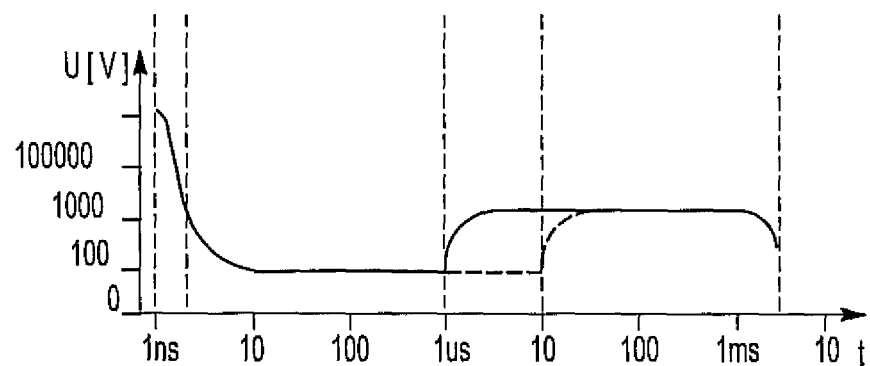
FIG. 12 is a graph of voltage as a function of time for electrical breakdown, arc creation, and flame kernel phases simulated according to an embodiment of the present invention.
Figure 13:
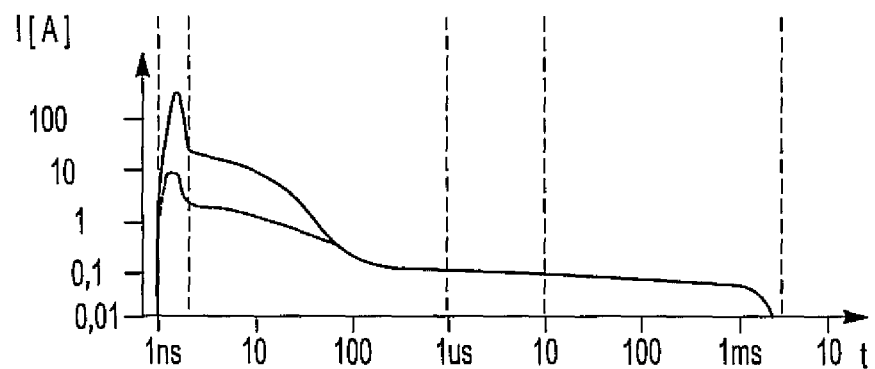
FIG. 13 is a graph of amperage as a function of time for of electrical breakdown, arc creation, and flame kernel phases simulated according to an embodiment of the present invention.

The voltage and current as a function of time and across the spark gap for the electrical breakdown, arc, and afterglow phases are shown in FIGS. 12 and 13, respectively. From these figures, it is appreciated that the initial electrical breakdown regime has a time period of the order of nanoseconds with a very high peak of voltage and current. Thereafter, the arc phase or regime duration is of the order of microseconds followed by the afterglow region that extends to milliseconds.

The overall efficiency of the ignition system can be determined by analyzing energy losses in the system, ignition delay and kernel formation rate. Ultimately, these parameters control flame speed and combustion stability, which contribute to the fuel efficiency of an internal combustion engine.

In view of the teaching presented herein, it is to be understood that numerous modifications and variations of the present invention will be readily apparent to those of skill in the art. As such, the foregoing is illustrative of specific embodiments of the invention, but is not meant to be a limitation upon the practice thereof. It is the following claims, including all equivalents, which define the scope of the invention.

We claim:

1. A process for designing and manufacturing an ignition system for an internal combustion engine, the process comprising:
providing a computer having primary and secondary memory, and a central processing unit;
performing a plurality of simulations using the computer, the simulations including:
simulating an internal combustion chamber for an internal combustion engine;
simulating a fuel mixture within the simulated internal combustion chamber;
simulating an electrical circuit with a simulated spark initiating device for igniting the simulated fuel mixture within the simulated internal combustion chamber;
simulating electrical breakdown proximate the simulated spark initiating device resulting in ionizing channels extending from the simulated spark initiating device and into the simulated fuel mixture;
simulating a plasma arc resulting from ionized fuel mixture proximate the simulated spark initiating device; and
simulating a transfer of energy from the simulated plasma arc to the simulated fuel mixture within the simulated internal combustion chamber;
analyzing results from the simulations and selecting parameters for an ignition system based on the analyzed simulation results; and
manufacturing an ignition system as a function of the selected parameters.

2. The process of claim 1, wherein the simulation of the electrical circuit is a function of ignition coil and spark plug parameters selected from a group consisting of a primary coil voltage, a primary coil current, a primary coil resistance, a primary coil inductance, a primary coil electrical energy, a secondary coil voltage, a secondary coil current, a secondary coil resistance, a secondary coil inductance, a secondary coil electrical energy, a spark plug voltage, a spark plug current, a spark plug resistance, a spark plug electrical energy and combinations thereof.

3. The process of claim 2, further including simulation as a function of parameters selected from a group consisting of a temperature of the fuel mixture within the spark plug gap, a pressure of the fuel mixture within the spark plug gap, a velocity of the fuel mixture within the spark plug gap, electrical properties of the fuel mixture within the spark plug gap, a chemical composition of the fuel mixture within the spark plug gap and combinations thereof.

4. The process of claim 1, wherein the simulation of the electrical breakdown is a function of parameters selected from a group consisting of a breakdown voltage, a breakdown current, a breakdown time duration, a breakdown temperature, a breakdown energy deposition, a breakdown energy efficiency and combinations thereof.

5. The process of claim 1, wherein the simulation of the plasma arc is a function of parameters selected from a group consisting of an arc voltage, an arc current, an arc duration, an arc temperature, an arc energy deposition, an arc energy efficiency and combinations thereof.

6. The process of claim 1, wherein the simulation of the transfer of energy from the plasma arc to remaining fuel mixture within the internal combustion chamber is a function of an afterglow voltage, an afterglow current, an afterglow duration, an afterglow temperature, an afterglow energy deposition, an afterglow energy efficiency and combinations thereof.

7. The process of claim 6, wherein the simulation is a function of turbulent flame propagation from a flame kernel to the remaining fuel mixture.

8. A process for designing and manufacturing an ignition system for an internal combustion engine, the process comprising:
    providing a computer having primary and secondary memory, and a central processing unit;
    selecting an internal combustion chamber for which an ignition system is needed;
    performing a plurality of simulations using the computer, the simulations including:
        simulating the selected internal combustion chamber;
        simulating an electrical circuit having a simulated ignition coil and a simulated spark plug with a gap between a simulated central electrode and a simulated side electrode;
        simulating a fuel mixture within the simulated internal combustion chamber and between the simulated central electrode and simulated side electrode of the simulated spark plug;
        simulating an electrical breakdown between the simulated central electrode and the simulated side electrode of the simulated spark plug;
        simulating ionizing of the simulated fuel mixture between the simulated central electrode and the simulated side electrode of the simulated spark plug and resulting from the simulated electrical breakdown;
        simulating a plasma arc between the simulated central electrode and the side electrode of the simulated spark plug resulting from ionizing of the simulated fuel mixture; and
        simulating a transfer of energy from the simulated plasma arc to a remaining simulated fuel mixture within the simulated internal combustion chamber;
    analyzing results from the simulations and selecting parameters for an ignition system based on the analyzed simulation results; and
    manufacturing an ignition system as a function of the selected parameters.

9. The process of claim 8, wherein the simulation of the electrical circuit is a function of ignition coil and spark plug parameters selected from a group consisting of a primary coil voltage, a primary coil current, a primary coil resistance, a primary coil inductance, a primary coil electrical energy, a secondary coil voltage, a secondary coil current, a secondary coil resistance, a secondary coil inductance, a secondary coil electrical energy, a spark plug voltage, a spark plug current, a spark plug resistance, a spark plug electrical energy and combinations thereof.

10. The process of claim 9, further including simulation as a function of parameters selected from a group consisting of a temperature of the fuel mixture within the spark plug gap, a pressure of the fuel mixture within the spark plug gap, a velocity of the fuel mixture within the spark plug gap, electrical properties of the fuel mixture within the spark plug gap, a chemical composition of the fuel mixture within the spark plug gap and combinations thereof.

11. The process of claim 8, wherein the simulation of the electrical breakdown is a function of parameters selected from a group consisting of a breakdown voltage, a breakdown current, a breakdown time duration, a breakdown temperature, a breakdown energy deposition, a breakdown energy efficiency and combinations thereof.

12. The process of claim 8, wherein the simulation of the plasma arc is a function of parameters selected from a group consisting of an arc voltage, an arc current, an arc duration, an arc temperature, an arc energy deposition, an arc energy efficiency and combinations thereof.

13. The process of claim 8, wherein the simulation of the transfer of energy from the plasma arc to remaining fuel mixture within the internal combustion chamber is a function of an afterglow voltage, an afterglow current, an afterglow duration, an afterglow temperature, an afterglow energy deposition, an afterglow energy efficiency and combinations thereof.

14. The process of claim 13, wherein the simulation is a function of turbulent flame propagation from a flame kernel to the remaining fuel mixture.

* * * * *